United States Patent
Chu et al.

(10) Patent No.: US 11,301,318 B2
(45) Date of Patent: Apr. 12, 2022

(54) METHOD AND SYSTEM FOR MANAGING MEMORY DEVICE

(71) Applicant: Western Digital Technologies, Inc., San Jose, CA (US)

(72) Inventors: Sanghoon Chu, San Jose, CA (US); Scott Jinn, Diamond Bar, CA (US); Yuriy Pavlenko, Mission Viejo, CA (US); Kum-Jung Song, Santa Clara, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/227,231

(22) Filed: Apr. 9, 2021

(65) Prior Publication Data

US 2021/0232452 A1    Jul. 29, 2021

Related U.S. Application Data

(63) Continuation of application No. 16/586,756, filed on Sep. 27, 2019, now Pat. No. 11,010,239, which is a
(Continued)

(51) Int. Cl.
*G06F 11/00* (2006.01)
*G06F 11/07* (2006.01)
(Continued)

(52) U.S. Cl.
CPC ........ *G06F 11/0793* (2013.01); *G06F 11/076* (2013.01); *G06F 11/0727* (2013.01);
(Continued)

(58) Field of Classification Search
CPC ............. G06F 11/0793; G06F 11/0727; G06F 11/076; G06F 2201/81; G06F 2201/85;
(Continued)

(56) References Cited

U.S. PATENT DOCUMENTS 7,609,561 B2    10/2009    Cornwell et al.
8,411,519 B2     4/2013    Byom et al.
(Continued)

OTHER PUBLICATIONS

Kulkarni et al., "Study of Bad Block Management and Wear Leveling in Nand Flash Memory," Oct. 2013, retrieved from http://esatjournals.net/ijret/2013v02/i10/IJRET20130210042.pdf.
(Continued)

*Primary Examiner* — Sarai E Butler
(74) *Attorney, Agent, or Firm* — Morgan, Lewis & Bockius LLP

(57) ABSTRACT

The subject technology provides for managing a data storage system. A data operation error for a data operation initiated in a first non-volatile memory die of a plurality of non-volatile memory die in the data storage system is detected. An error count for an error type of the data operation error for the first non-volatile memory die is incremented. The incremented error count satisfies a first threshold value for the error type of the data operation error is determined. The first non-volatile memory die is marked for exclusion from subsequent data operations.

20 Claims, 4 Drawing Sheets

Related U.S. Application Data continuation of application No. 15/396,405, filed on Dec. 30, 2016, now Pat. No. 10,452,468.

(51) Int. Cl.
 *G11C 29/44* (2006.01)
 *G11C 29/52* (2006.01)
 *G11C 29/00* (2006.01)

(52) U.S. Cl.
 CPC .............. *G11C 29/00* (2013.01); *G11C 29/44* (2013.01); *G11C 29/52* (2013.01); *G06F 2201/81* (2013.01); *G06F 2201/85* (2013.01); *G06F 2201/88* (2013.01)

(58) Field of Classification Search
 CPC ..... G06F 2201/88; G11C 29/44; G11C 29/52; G11C 29/00
 USPC ....................................................... 714/1–57
 See application file for complete search history.

(56) References Cited

U.S. PATENT DOCUMENTS

| | | | |
|---|---|---|---|
| 8,516,343 | B2 | 8/2013 | Flynn et al. |
| 8,887,027 | B2 | 11/2014 | Schuette et al. |
| 9,177,652 | B2 | 11/2015 | Oh |
| 9,286,176 | B1 | 3/2016 | Tomlin et al. |
| 9,390,003 | B2 | 7/2016 | Fisher et al. |
| 9,418,700 | B2 | 8/2016 | Ramanujan et al. |
| 2003/0005353 | A1 | 1/2003 | Mullins |
| 2003/0110248 | A1 | 6/2003 | Ritchie |
| 2007/0165461 | A1 | 7/2007 | Cornwell et al. |
| 2010/0251034 | A1* | 9/2010 | Zhang ................. G06F 11/0775 714/48 |
| 2012/0137184 | A1* | 5/2012 | Nakamura .......... H04L 43/0817 714/49 |
| 2013/0036327 | A1* | 2/2013 | Flynn .................. G06F 11/1096 714/6.3 |
| 2013/0080829 | A1* | 3/2013 | Colline ................ G06F 11/076 714/6.22 |
| 2014/0013182 | A1* | 1/2014 | Cheng ............... H03M 13/2906 714/758 |
| 2014/0095110 | A1 | 4/2014 | Chen et al. |
| 2014/0237298 | A1 | 8/2014 | Pe'er |
| 2015/0287478 | A1 | 10/2015 | Chen et al. |
| 2015/0324262 | A1 | 11/2015 | Chinnakkonda Vidyapoornachary et al. |
| 2016/0019111 | A1 | 1/2016 | Kochar et al. |
| 2016/0041873 | A1 | 2/2016 | Davis et al. |
| 2016/0070496 | A1 | 3/2016 | Cohen et al. |
| 2016/0085612 | A1 | 3/2016 | Liu |
| 2016/0098316 | A1* | 4/2016 | Lin ....................... G11C 29/42 714/764 |
| 2016/0162355 | A1* | 6/2016 | Mizrachi .............. G11C 16/349 714/57 |
| 2016/0202914 | A1 | 7/2016 | Hsu |
| 2018/0060148 | A1 | 3/2018 | Rudy |
| 2018/0060168 | A1* | 3/2018 | Kelly ................ H03M 13/2906 |

OTHER PUBLICATIONS

Micron Technology Inc, "TN-29-59: Bad Block Management in NAND Flash Memory," 2011, retrieved from https://www.micron.com/~/media/.../nand-flash/tn2959_bbm_in_nand_flash.pdf.

\* cited by examiner

| | BLOCK 1A | BLOCK 2A | BLOCK 3A | BLOCK 4A | TOTAL A | OPERATION ERROR TYPE |
|---|---|---|---|---|---|---|
| NON-VOLATILE MEMORY DIE 160A | 0 | 1 | 0 | 0 | 1 | READ ERROR |
| | 1 | 0 | 0 | 0 | 1 | PROGRAM ERROR |
| | 0 | 0 | 1 | 0 | 1 | ERASE ERROR |
| | BLOCK 1B | BLOCK 2B | BLOCK 3B | BLOCK 4B | TOTAL B | OPERATION ERROR TYPE |
| NON-VOLATILE MEMORY DIE 160B | 0 | 0 | 1 | 0 | 1 | READ ERROR |
| | 0 | 0 | 0 | 1 | 1 | PROGRAM ERROR |
| | 0 | 1 | 1 | 0 | 2 | ERASE ERROR |

FIG. 3

METHOD AND SYSTEM FOR MANAGING MEMORY DEVICE

CROSS-REFERENCE TO RELATED APPLICATIONS

This application is a continuation of application Ser. No. 16/586,756, filed on Sep. 27, 2019, now U.S. Pat. No. 11,010,239, which is a continuation of application Ser. No. 15/396,405, filed on Dec. 30, 2016, now U.S. Pat. No. 10,452,468, the entirety of each of which is incorporated herein by reference for all purposes.

BACKGROUND

The present disclosure relates generally to managing non-volatile memory. Non-volatile memory may experience data operation errors (e.g., read operation errors, write operation errors, or erase operation errors) which cause controllers to perform error recovery schemes to recover data from the non-volatile memory. Thus, data operation errors may lead to latency in completing data operations in non-volatile memory and negatively impact performance and reliability of the non-volatile memory.

SUMMARY

Aspects of the subject technology relate to a method for managing a data storage system. The method may include detecting a data operation error for a data operation initiated in a first non-volatile memory die of a plurality of non-volatile memory die in the data storage system. The method may also include incrementing an error count for an error type of the data operation error for the first non-volatile memory die. The method may further include determining the incremented error count satisfies a first threshold value for the error type of the data operation error. The method may also include marking the first non-volatile memory die for exclusion from subsequent data operations.

In certain aspects, the subject technology also relates to a data storage system including a plurality of storage devices, each storage device comprising a plurality of non-volatile memory die, and a controller coupled to the plurality of storage devices. The controller may be configured to detect a data operation error for a data operation initiated in a first non-volatile memory die of the plurality of non-volatile memory die in the data storage system. The controller may further be configured to increment an error count for an error type of the data operation error for the first non-volatile memory die. The controller may also be configured to determine the incremented error count satisfies a first threshold value for the error type of the data operation error. The controller may further be configured to mark the first non-volatile memory die for exclusion from subsequent data operations.

Aspects of the subject technology also relate to a machine-readable media encoded with executable instructions which, when executed by a processor, cause the processor to perform operations. The operations may include detecting a data operation error for a data operation initiated in a first non-volatile memory die of a plurality of non-volatile memory die in the data storage system, and incrementing an error count for an error type of the data operation error for the first non-volatile memory die, wherein the error count for the error type of the data operation error comprises a cumulative error count for all blocks of the first non-volatile memory die. The operations may also include determining the incremented error count satisfies a first threshold value for the error type of the data operation error. The operations may further include marking the first non-volatile memory die for exclusion from subsequent data operations.

According to other aspects of the subject technology, a data storage system is provided. The data storage system may include means for detecting a data operation error for a data operation initiated in a first non-volatile memory die of a plurality of non-volatile memory die in the data storage system. The data storage system may also include means for incrementing an error count for an error type of the data operation error for the first non-volatile memory die. The data storage system may further include means for determining the incremented error count satisfies a first threshold value for the error type of the data operation error. The data storage system may also include means for marking the first non-volatile memory die for exclusion from subsequent data operations.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

BRIEF DESCRIPTION OF THE DRAWINGS

FIG. 3 is a table illustrating relationships among non-volatile memory dies, blocks in each of non-volatile memory dies, data operation error types, and data operation error counts.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent that the subject technology may be practiced without these specific details. In some instances, structures and components are shown in block diagram form in order to avoid obscuring the concepts of the subject technology. Like components are labeled with identical element numbers for ease of understanding.

Controllers manage data storage systems, such as solid state drives (SSD), and perform data operations in non-volatile memory dies, such as NAND flash memory, of the data storage systems. For example, a controller may send a data operation command (i.e., write command, read command, or erase command) to a non-volatile memory die. In return, the non-volatile memory die may send an indication that an error occurred during the data operation and the data operation command could not be completed. In such a case, the controller may mark the block in which the operation failed as a bad block and remove the block from any future data operations. However, if the non-volatile memory die on which the bad block resides is a faulty non-volatile memory die, other blocks on the faulty non-volatile memory die may also experience data operation errors. Data operation errors lead to operation latency and negatively impact performance of data storage systems. The subject technology improves performance and reliability of data storage systems by monitoring data operation error counts of blocks across non-volatile memory die and excluding non-volatile memory die from future data operations when the data operation error counts for non-volatile memory die satisfy predetermined thresholds.

Figure 1:
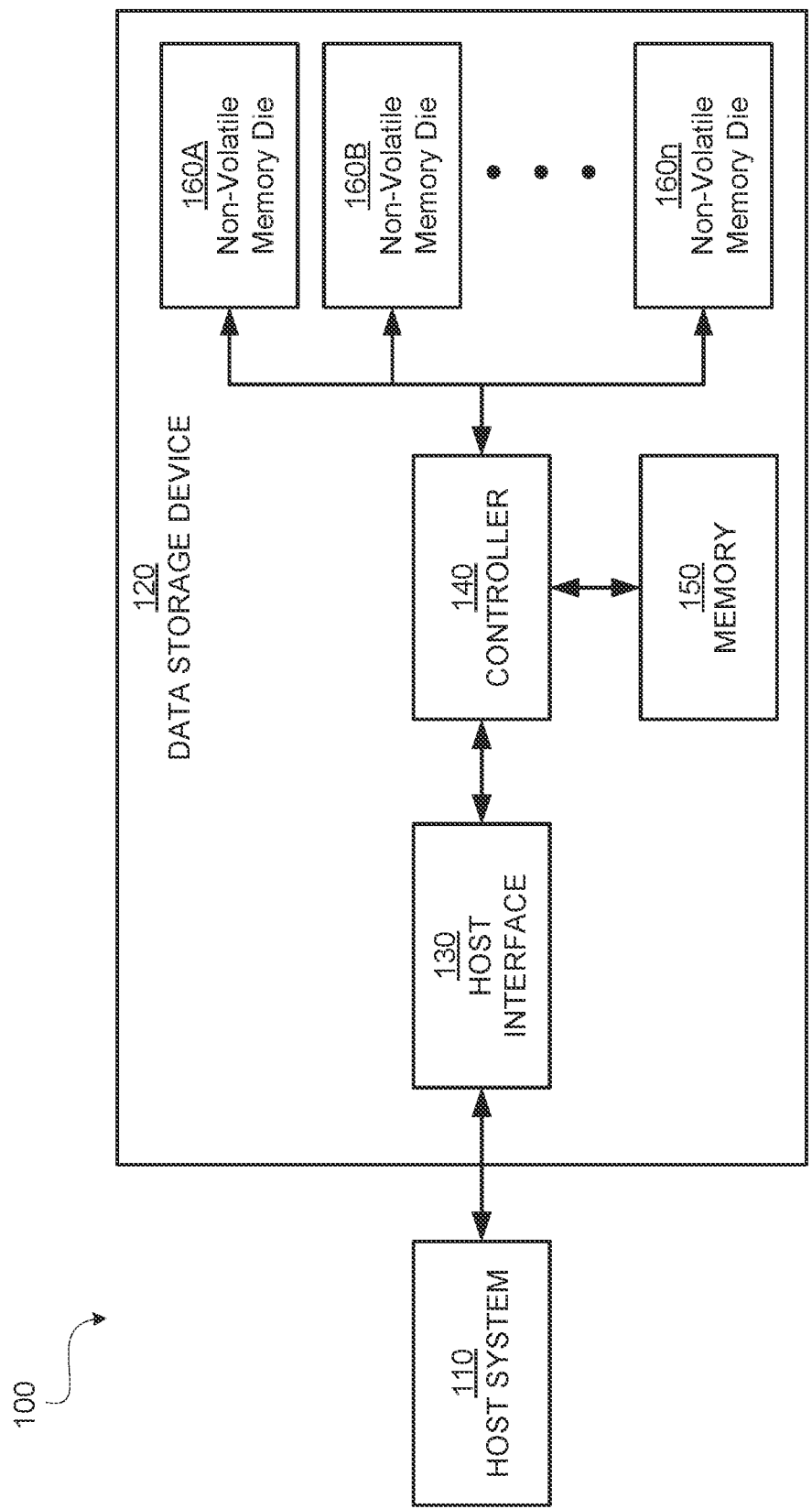
FIG. 1 is a block diagram depicting components of a system according to aspects of the subject technology.

FIG. 1 is a block diagram depicting components of an example data storage system 100 according to various implementations of the subject technology. Data storage system 100 may include host system 110 and data storage device 120. Data storage device 120 (for example, a solid state drive) may include host interface 130, controller 140, memory 150, and non-volatile memory dies 160A-160n.

Host system 110 represents any device configured to be coupled to data storage system 120 for storing data, to send data to and receive data from data storage system 120 via host interface 130. Host system 110 may be a computing system such as a personal computer, a server, a workstation, a laptop computer, PDA, smart phone, and the like. Alternatively, host system 110 may be an electronic device such as a digital camera, a digital audio player, a digital video recorder, and the like. Host system 110 may use logical addressing for data commands sent to data storage system 120. Data storage system 120 may then map logical addresses received from host system 110 to physical addresses of memory locations in non-volatile memory dies 160A-160n.

Host interface 130 may include both electrical and physical connections for operably coupling host system 110 to controller 140. Host interface 130 may be configured to communicate data, addresses, and control signals between host system 110 and controller 140. Host interface 130 may use any proprietary or standard interface protocols including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS), and Peripheral Component Interconnect Express (PCIe).

According to aspects of the subject technology, host interface 130 may implement a wireless connection between host system 110 and data storage device 120 using standardized or proprietary wireless interface standards and protocols. In this regard, host interface 130 or other components of data storage device 120 may include a wireless transceiver to place host system 110 and data storage device 120 in wireless communication with each other.

Controller 140 is configured to store data received from host system 110 in non-volatile memory dies 160A-160n in response to a write command from host system 110, and to read data stored in non-volatile memory dies 160A-160n and to transfer the read data to host system 110 via host interface 130 in response to a read command from host system 110. Controller 140 may include several internal components (not shown) such as one or more processors, read-only memory (ROM), a flash component interface (for example, a multiplexer to manage instruction and data transport along a connection to non-volatile memory dies 160A-160n), an I/O interface, error correction code (ECC) module, and the like. The ECC module may be configured to generate code words to be stored in non-volatile memory dies 160A-160n from data received from host system 110 and to decode code words read from non-volatile memory dies 160A-160n before sending the decoded data to the host system 110. Various ECC solutions may be used to encode and decode data to generate the code words. In some aspects, one or more elements of controller 140 may be integrated into a single chip. In other aspects, the elements may be implemented on multiple discrete components.

Controller 140, using one or more processor cores for example, may be configured to execute code or instructions to perform the operations and functionality described herein, manage request flow and address mappings, and to perform calculations and generate commands. The one or more processor cores of controller 140 may be configured to monitor and control the operation of the components in the controller 140 and data storage device 120. Controller 140 may include a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing.

Sequences of instructions may be stored as firmware on ROM within controller 140. Sequences of instructions also may be stored and read from memory 150, non-volatile memory dies 160A-160n, or received from host system 110 (for example, via a host interface 130). ROM, memory 150, non-volatile memory dies 160A-160n, represent examples of machine or computer readable media on which instructions/code executable by controller 140 may be stored. Machine or computer readable media may generally refer to any tangible and/or non-transitory media used to provide instructions to controller 140, its processor, including both volatile media, such as dynamic memory used for memory 150 or for buffers within controller 140, and non-volatile media, such as electronic media, optical media, and magnetic media.

Controller 140 may use memory 150 for temporary storage of data and information used to manage data storage device 120. In some aspects, memory 150 represents volatile memory used to temporarily store data and information used to manage data storage device 120. According to aspects of the subject technology, memory 150 may be random access memory (RAM) such as double data rate (DDR) RAM. Other types of RAM also may be used to implement memory 150. Memory 150 may be implemented using a single RAM module or multiple RAM modules. While memory 150 is depicted as being distinct from controller 140, those skilled in the art will recognize that memory 150 may be incorporated into controller 140 without departing from the scope of the present disclosure. Alternatively, memory 150 may be a non-volatile memory such as a magnetic disk, flash memory, and the like.

Non-volatile memory dies 160A-160n represent non-volatile memory devices for storing data. According to aspects of the subject technology, non-volatile memory dies 160A-160n include, for example, NAND flash memory. Non-volatile memory dies 160A-160n may comprise multilevel cell (MLC) flash memory and/or three-level cell (TLC) memory. In some aspects non-volatile memory dies 160A-160n may further comprise three-dimensional (3D) flash memory. In some aspects, non-volatile memory dies 160A-160n may comprise one or more hybrid memory devices that can function in one or more of a SLC, MLC, or TLC mode. The subject technology is not limited to these types of memory and may be applied to flash memory cells configured and operated using more than three levels (e.g., 4 bits per cell, 5 bits per cell, etc.).

Figure 2:
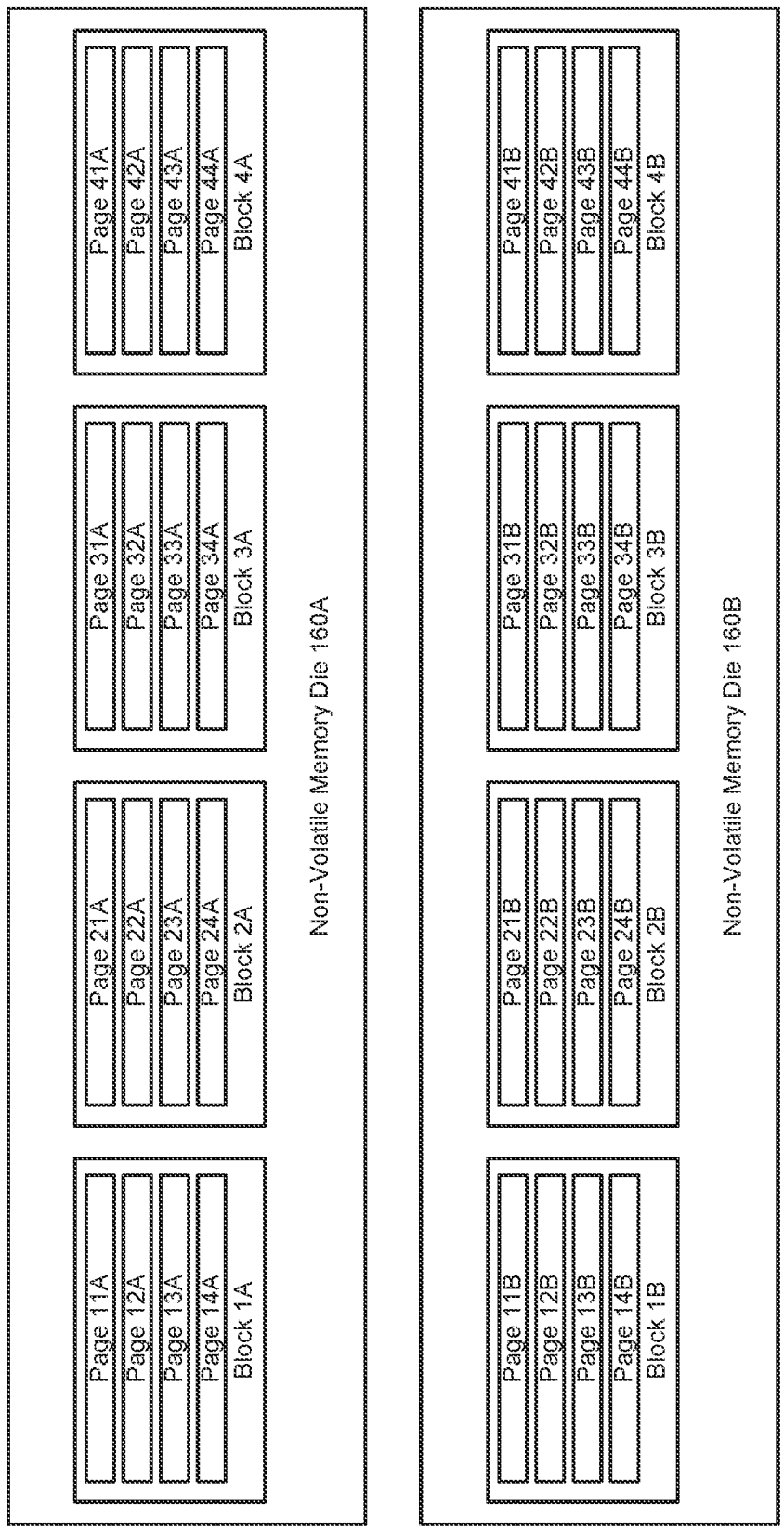
FIG. 2 is a block diagram depicting an example layout of a non-volatile memory according to aspects of the subject technology.

FIG. 2 is a block diagram depicting an example layout of non-volatile memory dies 160A and 160B according to aspects of the subject technology. The number of non-volatile memory dies 160A-160n in data storage device 120 may be any number such as two, four, eight, sixteen, etc. For simplicity of discussion, non-volatile memory dies 160A and 160B from non-volatile memory dies 160A-160n are depicted in FIG. 2. Non-volatile memory dies 160A and 160B are not limited to any particular capacity or configuration. Each of non-volatile memory dies 160A and 160B may be organized into blocks and pages. Each of blocks may include a number of pages, for example 256, and each of pages may contain one or more sectors or portions of data. For example, non-volatile memory die 160A includes blocks 1A, 2A, 3A, and 4A. Further, for example, block 1A includes pages 11A, 12, A, 13A, and 14A. The number of non-volatile memory dies per data storage device, the number of blocks per die, the number of pages per block, the number of sectors per page, and/or the size of the sectors are not limited to the numbers depicted in FIG. 2, but the numbers may vary.

FIG. 3 is a table 300 illustrating relationships among non-volatile memory dies, blocks in each of non-volatile memory dies, data operation error types, and data operation error counts. Table 300 may be stored in memory 150 and may be accessed and updated by controller 140. Alternatively, table 300 may be maintained in internal memory within controller 140.

Table 300 includes four columns indicating error counts for four blocks (i.e., blocks 1A-4A, blocks 1B-4B) in each of non-volatile memory dies (i.e., non-volatile memory dies 160A and 160B) in data storage device 120, and one column indicating total error counts for respective data operation error types across a non-volatile memory die (i.e., across the four blocks). For simplicity of discussion, only non-volatile memory dies 160A and 160B are shown in table 300. However, table 300 may include non-volatile memory dies (i.e., non-volatile memory dies 160A-160n) in data storage device 120. The data operation error types may include a read error type, a write (program) error type, or an erase error type. In some aspects, the assignment of data operations to the processor cores may change based on availability of the processor cores at the time of data operation.

In some aspects, each of the processor cores in controller 140 may be assigned a data operation (i.e., write operation, read operation, erase operation). For example, controller 140 may include eight processor cores, and five processor cores are assigned to perform data operations; two processor cores are assigned to perform write operations; two processor cores are assigned to perform read operations; and one processor core is assigned to perform erase operations.

For example, controller 140 may send a program command using a first processor core assigned to program operations to non-volatile memory die 160A to perform a program operation on page 12A of block 1A of non-volatile memory die 160A. However, non-volatile memory die 160A may experience an error during the program operation. Non-volatile memory die 160A may send an indication that the program operation on page 12A failed to the first processor core in controller 140. The first processor core increments the error count for a program operation error type under block 1A of non-volatile memory die 160A in table 300.

Controller 140 may send a read command using a second processor core responsible for read operations to non-volatile memory die 160B to read data in page 34B of block 3B of non-volatile memory die 160B. However, non-volatile memory die 160B may experience an error during the read operation to page 34B, and report the error to the second processor core in controller 140. Based on the received report, controller 140 increments the error count for a read operation error type under block 3B of non-volatile memory die 160B in table 300 as illustrated in table 300.

In some aspects of the subject technology, in response to the read command, non-volatile memory die 160B may return data from page 34B to the second processor core in controller 140. The second processor core may increment the error count for a read operation error type when hard decoding the data from page 34B fails. In some aspects, the second processor core may increment the error count for a read operation error type when soft decoding of the data fails and RAID recovery is performed on the data.

Controller 140 may send an erase operation using a third processor core responsible for erase operations to non-volatile memory die 160B to erase data of block 2B of non-volatile memory die 160B. However, non-volatile memory die 160B may experience an error during the erase operation, and report the error to the third processor core. Controller 140 increments the error count for an erase operation error type under block 2B in table 300. Controller 140 may mark block 2B as a bad block. In addition, controller 140 may relocate data stored in block 2B to another block in the data storage device and remove block 2B from future data operations.

In some aspects, sub-tables of table 300 may be stored in internal memory within controller 140 and may be accessible by the processor cores in controller 140. The sub-tables may be associated with specific data operation errors and may be accessible to the processor cores assigned to the data operation associated with the data operation error. For example, each of the third and fourth processor cores assigned to perform erase operations may be associated with a first erase error sub-table and a second erase error sub-table, respectively. The third processor core may be designated as an erase error sub-table manager. The erase error sub-table manager (i.e., the third processor core) may accumulate the error counts for erase operation error type for respective non-volatile memory dies from all processor cores assigned to erase operation (i.e., the fourth processor core), and writes the accumulated error count for the respective non-volatile memory dies to table 300.

In some aspects, the first processor core may maintain a sub-table of table 300 for error counts associated to program operation errors. The first processor core may write the total error count of the program operation errors to memory 150 to update table 300 with the total error count of the program operation errors for the corresponding non-volatile memory die (i.e., non-volatile memory die 160A).

Controller 140 sums error counts of the blocks for respective operation error types, and determines the total error counts of respective operation error types for each of non-volatile memory dies. For example, one error is marked for block 2A for read operation error type. Thus, controller 140 enters one in the column of total A for read operation error type in non-volatile memory die 160A. Controller repeats the same or similar steps to determine total error counts for all of operation error types in both non-volatile memory dies 160A and 160B.

Controller 140 may determine whether a total error count for a specific data operation error type for non-volatile memory die satisfies a predetermined threshold value after an error count for the specific data operation error type is incremented. Alternatively, controller 140 may perform the determination periodically or after a predetermined number of data operations are executed.

Controller 140 may mark non-volatile memory die that includes one or more total error counts satisfying the predetermined threshold value for exclusion from future data operation. Controller 140 may maintain an exclusion table that includes, for example, a list of non-volatile memory dies 160A-160n. For instance, when controller 140 determines that the total error count for write operation error type in non-volatile memory die 160B satisfies a predetermined threshold value, controller 140 may flag or mark non-volatile memory die 160B on the list in the exclusion table that non-volatile memory die 160B is excluded from subsequent data operations. For example, when controller 140 receives a write command from host system 110 after controller 140 determines that the total error count for write operation error type in non-volatile memory die 160B satisfies a predetermined threshold value, controller 140 may reference the exclusion table and select blocks or pages of non-volatile memory die other than non-volatile memory die 160B to write data to.

However, controller 140 may continue to send a read command to non-volatile memory die 160B until all data on non-volatile memory die 160B is relocated to non-volatile memory die which is not marked for exclusion. Alternatively, after controller marks non-volatile memory die for exclusion, controller may execute a garbage collection operation on all blocks on the non-volatile memory die. For example, controller 140 may not send any data operation command to non-volatile memory die 160B which is marked for exclusion, and execute a garbage collection operation on non-volatile memory die 160B to relocate data in non-volatile memory die 160B to non-volatile memory die 160A.

The predetermined threshold value may be based on a percentage of the number of blocks in a non-volatile memory die. For example, non-volatile memory die 160B includes four blocks (i.e., blocks 1B-4B), and the percentage may be set to fifty-percent. Thus, the threshold value to which the total error counts for respective operation error types in non-volatile memory die 160B is set to two. Referring to table 300, blocks 2B and 3B of non-volatile memory die 160B both have one erase error count, thus, the total error count for the erase operation error type for non-volatile memory die 160B is two. Because at least one of the total error counts for non-volatile memory die 160B satisfies the threshold value (i.e., two), controller 140 marks non-volatile memory die 160B for exclusion from future data operations to be performed to any blocks or pages in non-volatile memory die 160B.

The threshold value for total error counts may be configurable depending on the life state of the data storage device. For example, when the data storage device is at an early state of life, non-volatile memory die is less likely to experience errors that may occur due to a high wear level. Thus, the threshold at the early state of life of the data storage device may be set to 25 percent of the total number of blocks in the non-volatile memory die. On the other hand, when the data storage device nears end of its lifespan, the data storage device becomes more susceptible to errors due to a high wear level. Thus, the threshold value close to the end state of life of the data storage device may be set to a higher percentage, such as fifty percent, than that of the early state of life.

Figure 4:
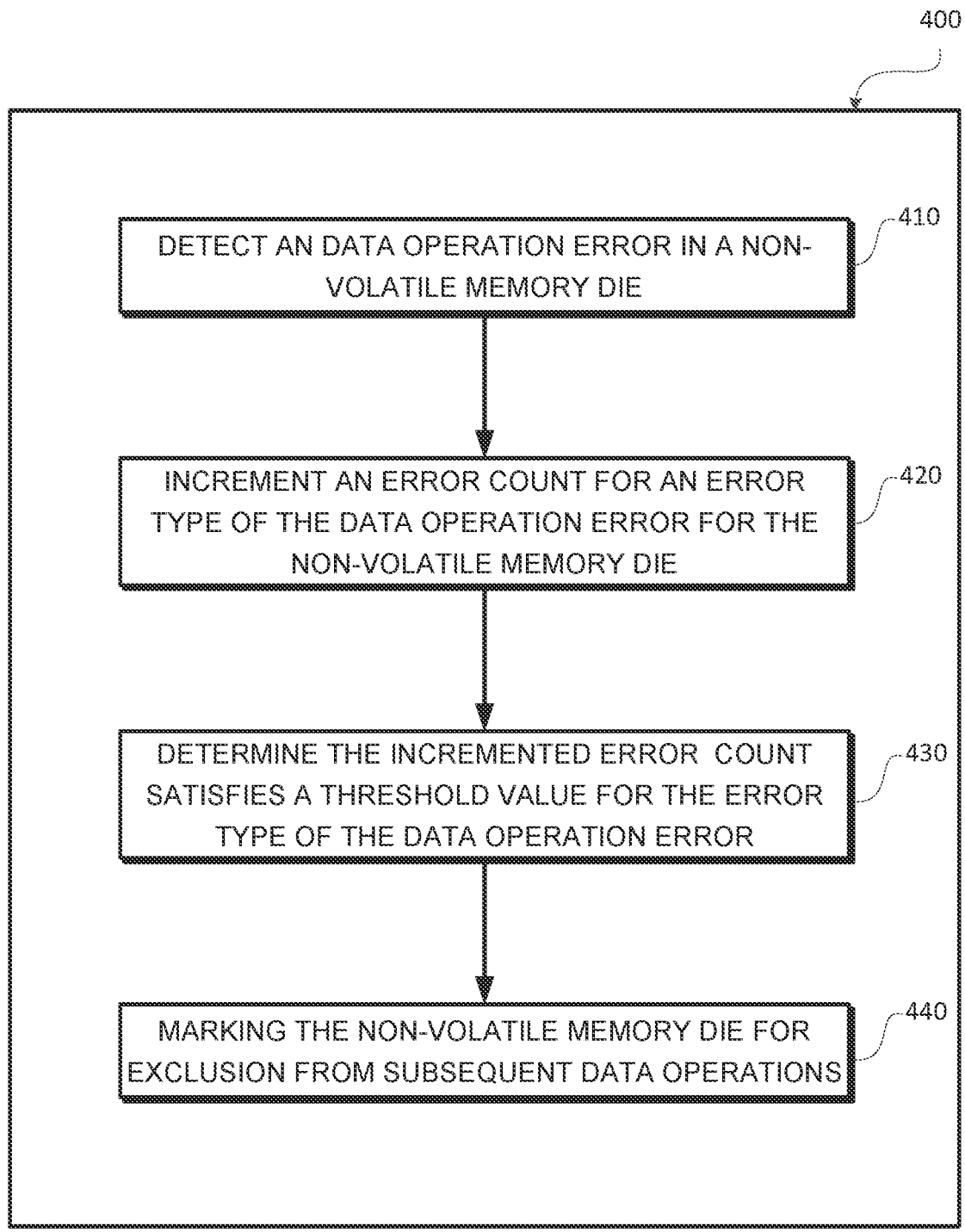
FIG. 4 depicts a flow diagram of an example process for managing a data storage system according to aspects of the subject technology.

FIG. 4 depicts a flow diagram of an example process 400 for managing data storage device 120 according to aspects of the subject technology. For explanatory purposes, the various blocks of example process 400 are described herein with reference to the components and/or processes described herein. The one or more of the blocks of process 400 may be implemented, for example, by one or more processors, including, for example, controller 140 of FIG. 1 or one or more components or processors of controller 140. In some implementations, one or more of the blocks may be implemented apart from other blocks, and by one or more different processors or controllers. Further for explanatory purposes, the blocks of example process 400 are described as occurring in serial, or linearly. However, multiple blocks of example process 400 may occur in parallel. In addition, the blocks of example process 400 need not be performed in the order shown and/or one or more of the blocks of example process 400 need not be performed.

At block 410, a controller detects a data operation error for a data operation initiated in a non-volatile memory die in a plurality of non-volatile memory dies in a data storage device. For example, controller 140 may send a read operation command to non-volatile memory die 160B based on a command received from host system 110 via host interface 130. Non-volatile memory die 160B may read data in page 31B of block 3B, and send the data to controller 140. However, during hard decoding of the data, controller 140 may encounter an error. In response to the error during the hard decoding, controller 140 may proceed to perform soft decoding on the data of page 31B to recover the data. When controller 140 encounters an error during the soft decoding, controller 140 may perform RAID recovery to recover the data. Alternatively, non-volatile memory die 160B may encounter an error and not complete the read operation. In such a case, instead of sending the data of page 31B, non-volatile memory die 160B may report the error to controller 140.

At block 420, the controller increments an error count for an error type of the data operation error for the non-volatile memory die. For example, controller 140 increments an error count of the read operation for block 3B in non-volatile memory die 160B when controller 140 encounters an error during hard decoding of the data from page 31B. In some aspects, controller 140 may increment the error count of the read operation for block 3B when controller 140 encounters an error during the soft decoding of the data form page 31B or when controller 140 performs RAID recovery. Alternatively, controller 140 may increment the error count of the read operation for block 3B when controller 140 receives a report of an error from non-volatile memory die 160B.

At block 430, the controller determines that the incremented error count satisfies a threshold value for the error type of the data operation error. For example, the total error count for the read operation error type in non-volatile 160B is compared to a threshold value. The threshold value may be a predetermined percentage of a total number of blocks in the non-volatile memory die. For instance, if a non-volatile memory die includes four thousand blocks, the threshold value for an error type may be two thousand error counts which are 50 percent of the four thousand blocks in the non-volatile memory die. Further, threshold values for error counts may be different for each of the error types.

Furthermore, the threshold values for error counts may be configurable depending on the life state of the data storage device.

In some aspects, the controller may maintain a consecutive count for an error type for a die, and increment the consecutive count when the same data operation error is detected consecutively. Controller may maintain a consecutive error count for respective error types for each of non-volatile memory dies. For example, controller 140 may consecutively receive a first notification from non-volatile memory die 160B regarding an erase operation error in block 2B and a second notification from non-volatile memory die 160B also indicating an erase operation error in block 3B one after another. Controller 140 may increment a consecutive error count for the erase operation errors in non-volatile memory die 160B. However, when controller 140 receives a third notification indicating successful completion of an erase operation in block 3B of non-volatile memory die 160B, controller 140 may reset the consecutive error count for the erase operation error in block 3B.

Alternatively, a controller may maintain a consecutive error count for all error types in each of non-volatile memory dies. For example, controller 140 may consecutively receive a first notification indicating a program operation error from non-volatile memory die 160A and a second notification indicating an erase operation error from non-volatile memory die 160A one after another. Controller 140 increments a consecutive error count for non-volatile memory die 160A. However, when controller 140 receives a third notification indicating successful completion of a read operation from non-volatile memory die 160A, controller may reset the consecutive error count for non-volatile memory die 160A. The operation-specific consecutive error count threshold value may be equal to or less than the error count threshold value. Further, the operation-specific consecutive error count threshold value may be less than the non-volatile memory die specific consecutive error count threshold value.

At block 440, the controller marks the non-volatile memory die whose error count of an error type satisfies the error count threshold value for exclusion from subsequent data operations. For example, controller 140 may mark non-volatile memory die 160B if the erase operation error count for non-volatile memory die 160B is determined to satisfy the error count threshold value. Controller 140 may also exclude non-volatile memory die 160B from future data operations. In some aspects, the controller may mark the non-volatile memory die whose consecutive count of an error type satisfies the consecutive count threshold value for exclusion from subsequent data operations. For instance, controller 140 may mark non-volatile memory die 160B for exclusion from future data operations if the operation-specific consecutive error count for the erase operation satisfies the operation-specific consecutive error count threshold value. For example, controller 140 may mark non-volatile memory die 160A for exclusion from future data operations if the non-volatile memory die specific consecutive error count satisfies the non-volatile memory die specific consecutive error count threshold value.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader).

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an implementation may apply to all aspects, or one or more aspects. An implementation may provide one or more examples. A phrase such as an "embodiment" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for managing a data storage system, the method comprising:
   detecting a first memory operation error of a first memory device of memory devices in the data storage system;
   detecting a second memory operation error of the first memory device;
   incrementing a first error type consecutive count when the first and second memory operation errors are of a first error type and detected consecutively;
   incrementing a device consecutive error count, and refraining from incrementing the first error type consecutive count, when the first and second memory operation errors are of different error types and detected consecutively; and
   identifying the first memory device to be excluded from participating in subsequent memory operations when the first error type consecutive count satisfies a first threshold value for the first error type.

2. The method of claim 1, wherein:
   when the first and second memory operation errors are of the first error type and detected consecutively, the device consecutive error count is maintained without being incremented; and
   when the first and second memory operation errors are detected without being consecutive to each other, the first error type consecutive count and the device consecutive error count are maintained without being incremented.

3. The method of claim 1, wherein:
   when the first error type consecutive count satisfies the first threshold value for the first error type, identifying the first memory device comprises identifying the first memory device to be excluded from participating in subsequent memory operations of a first memory operation type, while permitting the first memory device to participate in subsequent memory operations of a second memory operation type; and
   wherein the first memory operation type is different from the second memory operation type.

4. The method of claim 3, wherein the first memory operation type is a write operation type, and the second memory operation type is a read operation type.

5. The method of claim 1, comprising: identifying the first memory device to be excluded from participating in subsequent memory operations when the device consecutive error count satisfies a second threshold value.

6. The method of claim 1, wherein:
   the first error type is associated with a first memory operation type; and
   the method comprises: resetting the first error type consecutive count associated with the first error type for the first memory device when a memory operation of the first memory operation type is successfully completed for the first memory device.

7. The method of claim 1, wherein:
   the different error types are associated with first and second memory operation types; and the method comprises: resetting the device consecutive error count for the first memory device when a memory operation of a third operation type is successfully completed for the first memory device.

8. The method of claim 1, wherein when the first and second memory operation errors of the first memory device are detected without being consecutive to each other, the first error type consecutive count and the device consecutive error count are maintained without being incremented.

9. A data storage system, comprising:
   memory devices; and
   one or more controllers configured to cause:
   detecting a first memory operation error of a first memory device of the memory devices;
   detecting a second memory operation error of the first memory device;
   incrementing a first error type consecutive count when the first and second memory operation errors are of a first error type and detected consecutively;
   incrementing a device consecutive error count, and refraining from incrementing the first error type consecutive count, when the first and second memory operation errors are of different error types and detected consecutively; and
   identifying the first memory device to be excluded from participating in subsequent memory operations when the first error type consecutive count satisfies a first threshold value for the first error type.

10. The data storage system of claim 9, wherein:
    when the first and second memory operation errors are of the first error type and detected consecutively, the one or more controllers are configured to cause the device consecutive error count to be maintained without being incremented; and
    when the first and second memory operation errors are detected without being consecutive to each other, the one or more controllers are configured to cause the first error type consecutive count and the device consecutive error count to be maintained without being incremented.

11. The data storage system of claim 9, wherein:
    when the first error type consecutive count satisfies the first threshold value for the first error type, identifying the first memory device comprises identifying the first memory device to be excluded from participating in subsequent memory operations of a first memory operation type while permitting the first memory device to participate in subsequent memory operations of a second memory operation type; and
    wherein the first memory operation type is different from the second memory operation type.

12. The data storage system of claim 11, wherein the first memory operation type is a write operation type, and the second memory operation type is a read operation type.

13. The data storage system of claim 9, wherein the one or more controllers are configured to cause identifying the first memory device to be excluded from participating in subsequent memory operations when the device consecutive error count satisfies a second threshold value.

14. The data storage system of claim 13, wherein the second threshold value is greater than the first threshold value.

15. The data storage system of claim 9, wherein:
    the first error type is associated with a first memory operation type; and
    the one or more controllers are configured to cause:
    resetting the first error type consecutive count associated with the first error type for the first memory device when a memory operation of the first memory operation type is successfully completed for the first memory device.

16. The data storage system of claim 9, wherein:
the different error types are associated with first and second memory operation types; and
the one or more controllers are configured to cause: resetting the device consecutive error count for the first memory device when a memory operation of a third operation type is successfully completed for the first memory device.

17. The data storage system of claim 9, wherein the first error type consecutive count comprises a cumulative error count for all blocks of the first memory device.

18. The data storage system of claim 9, wherein:
the first error type comprises one of a program error type, a read error type, or an erase error type;
the one or more controllers are configured to cause maintaining a respective error type consecutive count for the first memory device for each of the program error type, the read error type, and the erase error type; and
the one or more controllers are configured to cause maintaining a respective threshold value for each of the program error type, the read error type, and the erase error type.

19. An apparatus, comprising:
means for detecting a first memory operation error of a first memory device of memory devices in a data storage system;
means for detecting a second memory operation error of the first memory device;
means for incrementing a first error type consecutive count when the first and second memory operation errors are of a first error type and detected consecutively;
means for incrementing a device consecutive error count, and refraining from incrementing the first error type consecutive count, when the first and second memory operation errors are of different error types and detected consecutively; and
means for identifying the first memory device to be excluded from participating in subsequent memory operations when the first error type consecutive count satisfies a first threshold value for the first error type.

20. The apparatus of claim 19, wherein:
when the first error type consecutive count satisfies the first threshold value for the first error type, the means for identifying the first memory device comprises means for identifying the first memory device to be excluded from participating in subsequent memory operations of a first memory operation type, while permitting the first memory device to participate in subsequent memory operations of a second memory operation type; and
wherein the first memory operation type is different from the second memory operation type.

* * * * *